United States Patent [19]
Caddock, Jr. et al.

[11] Patent Number: 5,621,378
[45] Date of Patent: Apr. 15, 1997

[54] HEATSINK-MOUNTABLE POWER RESISTOR HAVING IMPROVED HEAT-TRANSFER INTERFACE WITH THE HEATSINK

[75] Inventors: Richard E. Caddock, Jr., Winchester; Richard E. Caddock, Roseburg, both of Oreg.

[73] Assignee: Caddock Electronics, Inc., Riverside, Calif.

[21] Appl. No.: 425,913

[22] Filed: Apr. 20, 1995

[51] Int. Cl.⁶ .................................................. H01C 1/08
[52] U.S. Cl. .......................... 338/51; 338/159; 338/226; 338/275
[58] Field of Search .............................. 338/51, 53, 273, 338/274, 275, 226, 324, 159

[56] References Cited

U.S. PATENT DOCUMENTS

| 5,304,977 | 4/1994 | Caddock, Jr. | 338/275 |
| 5,391,178 | 2/1995 | Strief et al. | 338/226 |
| 5,481,241 | 1/1996 | Caddock, Jr. | 338/51 |

*Primary Examiner*—Tu B. Hoang
*Attorney, Agent, or Firm*—Richard L. Gausewitz

[57] ABSTRACT

A power resistor having much improved heat dissipation ability to an underlying heatsink because a step or protuberance is provided that cooperates with the mounting bolt or screw to largely nullify the effects of molding-caused camber or curvature.

19 Claims, 2 Drawing Sheets

HEATSINK-MOUNTABLE POWER RESISTOR HAVING IMPROVED HEAT-TRANSFER INTERFACE WITH THE HEATSINK

BACKGROUND OF THE INVENTION

For years, a certain type of power package—having synthetic resin (plastic) surrounding a mounting hole—has been popular for electronic components such as power semiconductors and power resistors. Examples include the Motorola "Full Pak" power semiconductors and Caddock MP816, MP850, and MP930 power resistors. In this type of package, the active element and its support structure are often located in close heat-dissipating relationship to the bottom (mounting surface) of the device and thus to an external heatsink on which the device is mounted. Mounting to the external heatsink is typically effected by a single bolt (screw).

There is always a need for increased power ratings in electronic or electrical devices, especially where the increased power ratings may be achieved at substantially no cost. Accordingly, it would be a distinct benefit to the industry if power resistor devices of the type indicated could—at little or no cost—be so constructed as to have higher power ratings.

SUMMARY OF THE INVENTION

When the active element of the power resistor is located well below center (well below the medial plane of the device), such as at the bottom of the device or bonded to a metal piece that is located at the bottom of the device, the package develops, inherently, a slight camber or bend. (The camber or bend is not necessarily a smooth curvature.) This is true even though the bottom surface of the mold for the package (body) is flat and the synthetic resin forming the package is a rigid epoxy (or equivalent). The indicated camber or bend is convex at the mounting (bottom) surface of the device (the surface adjacent the external heatsink), and is oriented longitudinally of the device. (There is also a side-to-side camber which is less, due to the geometry of the part.)

The cause of the camber is the higher thermal coefficient of expansion (TCE) of the plastic (molding material) relative to the active element or active element with bonded metal piece. During the cooling down of the device following the high temperature molding process, the higher TCE of the plastic and the relatively thick section above the active element cause the bending force and result in the bend or camber. In addition, the shrinkage resulting from the post-molding cure of the molding plastic adds further to the force or forces that cause the camber.

The molding process indicated in the specification is typically transfer molding; it may also be (for example) injection-molding.

The indicated camber is typically in the range of about 0.0005 inch to 0.0040 inch for parts having common sizes, depending upon the type of plastic (that is to say, depending upon the TCE and cure shrinkage of the particular plastic). The convex bend (camber) at the bottom surface of the device reduces the power handling capability or performance of the indicated power package. When the single bolt is used to mount the device to the heatsink, the device end remote from the bolt (this being typically the end having the terminals) is lifted off the heatsink by what may be termed rocker action. Such lifting creates a space between the heatsink and the mounting (bottom) surface of the part, thus reducing the power handling capability. Such space has a high thermal impedance even when it is filled with thermal grease. Stated otherwise, when compared to a much smaller space or no space, the indicated space resulting from the rocker action has a thermal impedance that is sufficiently higher to substantially affect the power rating of the electronic device.

The present invention involves power resistors wherein the application of mounting force is not at the center but instead relatively adjacent one end. Such application of mounting force is typically by means of a single bolt (screw) extending through a hole in the synthetic resin.

In accordance with another aspect of the invention, a molded step or protuberance is provided on the package—namely, on the underside of the synthetic resin—at the end that is relatively adjacent the hole for the bolt. Preferably, the step is located at the extreme edge region of the mounting surface at the end remote from the terminals.

In accordance with another aspect of the invention, the protuberance or step is caused to have a height (relative to the mounting surface) that is selected to compensate for the indicated camber. Stated otherwise, the step is so constructed, intentionally, as to cause the space between the mounting surface and the heatsink—at the portion remote from the bolt hole—to be reduced substantially or eliminated. Such substantial reduction or elimination of the space causes better thermal contact between the heatsink and the heat-generating active element region of the resistor. The results are higher power capability and/or more reliable performance.

In the preferred form, the indicated step or protuberance extends along the edge and is spaced from the bolt hole, that is to say, set back from the hole in a direction away from the terminals, to thereby increase the rotational moment that is present when the bolt is tightened. The result is a greater downward force at the heat-dissipating portion of the device that is remote (toward the terminals) from the hole. The indicated downward force pushes with greater force the heat-dissipating portion of the package, towards the heatsink, and acting against the viscous thermal grease that is used as a thermal interface material between the heatsink and the mounting surface of the device. Such greater downward force improves the thermal interface between device and heatsink.

The relationship between the step, the bolt and the heat-dissipating portion is in the nature of a third-class lever.

The invention is applicable to "TO-220" power packages, and also other power packages, that have plastic surrounding the single bolt hole and where the hole is offset from the center of the package.

DETAILED DESCRIPTION OF THE PREFERRED EMBODIMENTS

Figure 6:
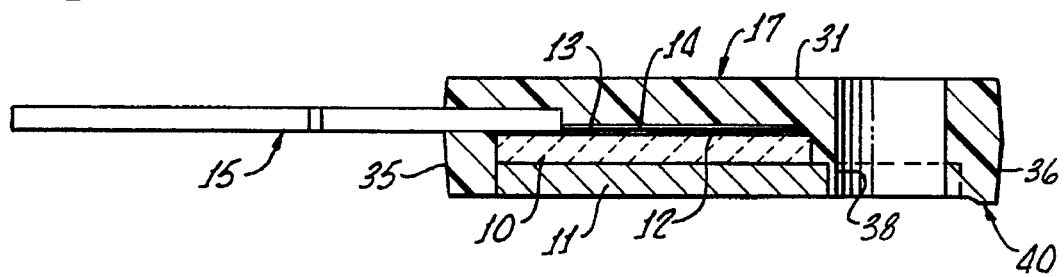
FIG. 6 is a longitudinal sectional view of one type of power resistor in which the present invention is incorporated.

U.S. Pat. Nos. 5,291,178, issued Mar. 1, 1994, and 5,304,977, issued Apr. 19, 1994, are hereby incorporated by reference herein, except that FIG. 8 of U.S. Pat. No. 5,304,977 is not incorporated herein. FIG. 6 hereof is (except for the protuberance) from U.S. Pat. No. 5,291,178, and FIG. 7 hereof is (except for the protuberance) from U.S. Pat. No. 5,304,977 (and except that each number in FIG. 7 hereof is followed by the letter "a").

Figure 1:
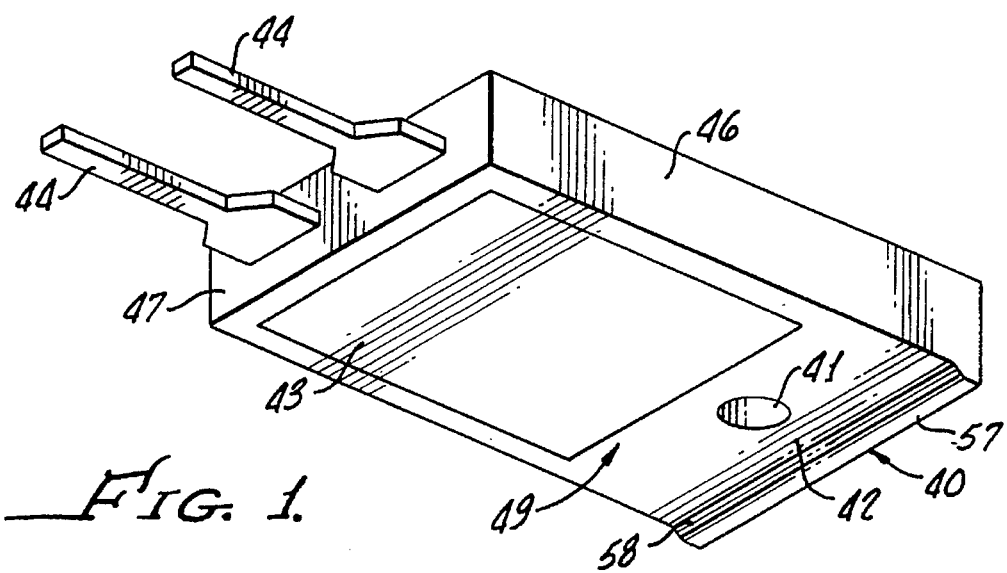
FIG. 1 is an enlarged isometric view, as viewed from below, of a power resistor incorporating the present invention.
Figure 2:
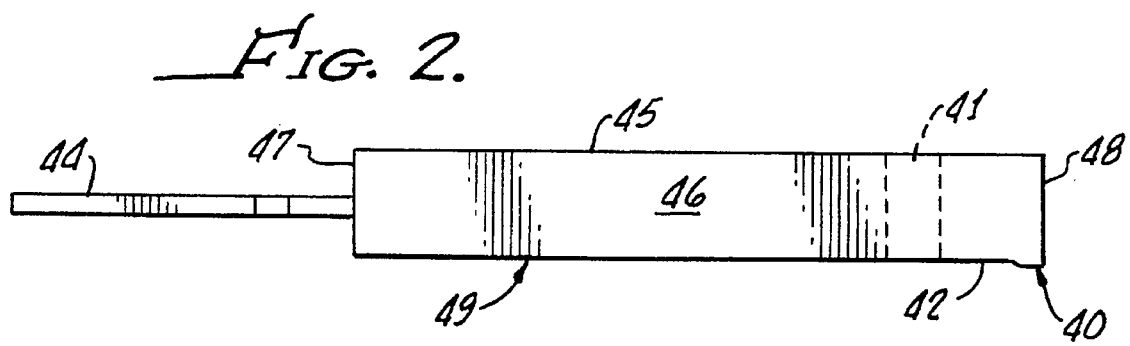
FIG. 2 is a side elevational view of the resistor of FIG. 1.
Figure 7:
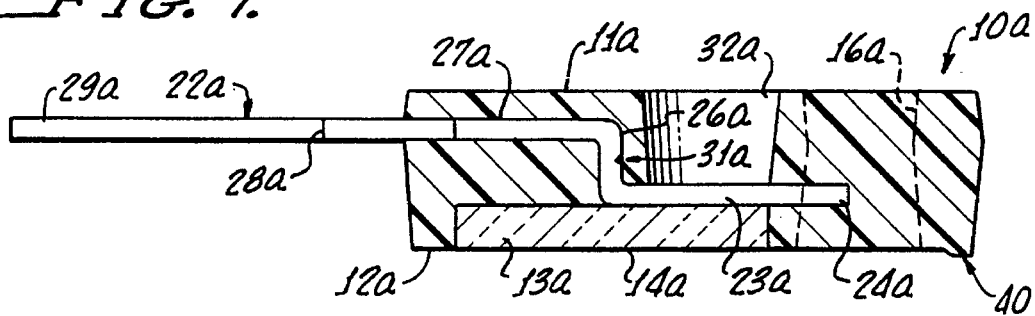
FIG. 7 is a longitudinal sectional view illustrating another type of resistor in which the present invention is incorporated.

FIG. 1 shows a power resistor (or molded package) that is identical to the resistor (or package) of FIG. 7 hereof, or to the resistor (or package) of FIG. 6 hereof. There is a step or protuberance 40 on the lower side of the resistor (package), at the end of the bottom (mounting) surface that is nearest the off-center bolt hole (screw hole) 41. Step 40 is spaced from hole 41 by a space 42.

Step 40, hole 41, and space 42 are on the portion of the resistor that is remote from the primary heat-dissipating surface 43 of the resistor. Surface 43 is the lower surface of the ceramic substrate of the active element, or is the lower surface of a metal piece bonded to the active element, reference being made to the cited patents. Leads (terminals) 44 are normally on the same portion of the resistor as is the surface 43, being therefore remote from step 40, hole 41, and space 42.

The illustrated preferred power resistor has a molded body (package) that is substantially rectangular and elongate in the direction of terminals 44. It has a top surface 45; mirror-image side surfaces 46; end surfaces 47, 48; and a bottom surface 49. Bottom surface 49 is the mounting surface adapted to engage the upper flat surface of a heatsink such as a chassis, metal plate, etc. Bottom surface 49 is flat, except for the above-stated slight camber or bend. Hole 41 is substantially perpendicular to bottom surface 49.

The heat-dissipating surface 43 is flush with the remainder of bottom surface (mounting surface) 49.

All of the surfaces of the resistor (resistor package) are synthetic resin (plastic), except the surface 43 which is ceramic or metal.

Figure 4:
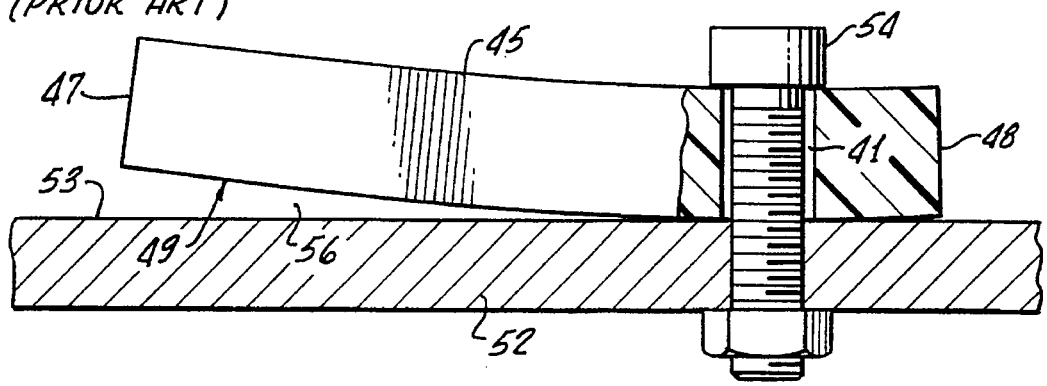
FIG. 4 is a schematic, exaggerated, primarily side elevational view, showing prior art, and illustrating the rocker effect that occurs in the absence of the present invention, the terminals being unshown.
Figure 5:
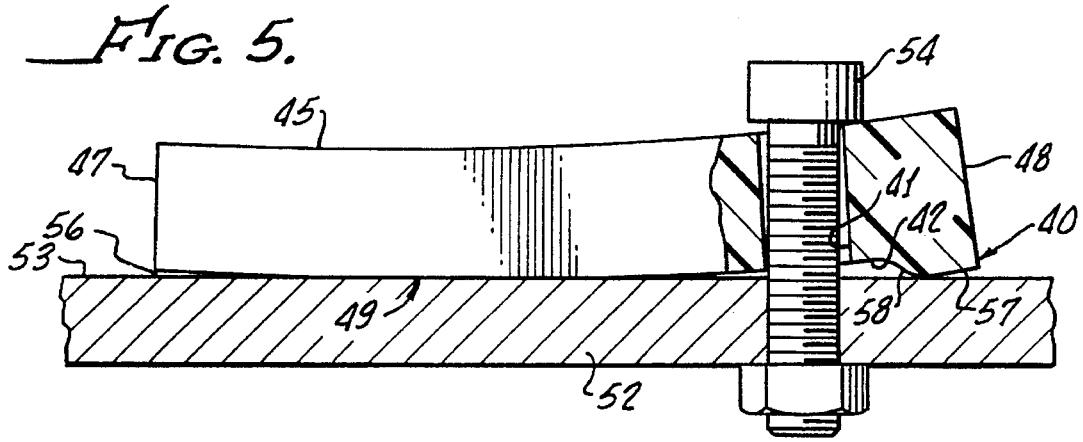
FIG. 5 is a schematic view, also exaggerated, showing the present invention, the terminals being unshown.

The schematic, exaggerated views of FIGS. 4 and 5, each represent FIG. 7 hereof. As a second embodiment, each of FIGS. 4 and 5 hereof represents FIG. 6 hereof. In each instance, FIG. 4 does not incorporate the present invention whereas FIG. 5 does.

A copper (or aluminum, etc.) heatsink plate 52 having a flat upper surface 53 is shown in FIGS. 4 and 5, having a bolt hole adapted to receive the indicated bolt 54 (screw) that is perpendicular thereto. A bolt 54 (screw) extends through bolt hole 41 and is tightened down relative to the heatsink 52.

Referring to FIG. 4, this shows how—absent the invention—tightening of bolt 54 results in a rocking action by which the portion of the resistor adjacent bolt hole 41 is held down, but the portion remote from the bolt hole is lifted up so as to form a gap 56. Even though gap 56 is filled with thermal grease or other thermal conduction-enhancing substance (not shown), the condition of FIG. 4 is such as to markedly retard transmission of heat from the ceramic substrate (which is numbered 13a in FIG. 7 hereof from U.S. Pat. No. 5,304,977) to heatsink 52.

Referring to FIG. 5, when the present invention is employed, the step 40 operates upon tightening of bolt 54 to cause the region of the bottom surface 49 remote from the step to come close to or engage upper surface 53 of the heatsink over a wide area. Thus, the gap 56 is greatly reduced and the amount of thermal grease interposed between the somewhat curved or cambered bottom surface 49 and the flat upper surface 53 is greatly reduced. The improvement in power rating, compared to the construction of FIG. 4, is substantial.

Figure 3:
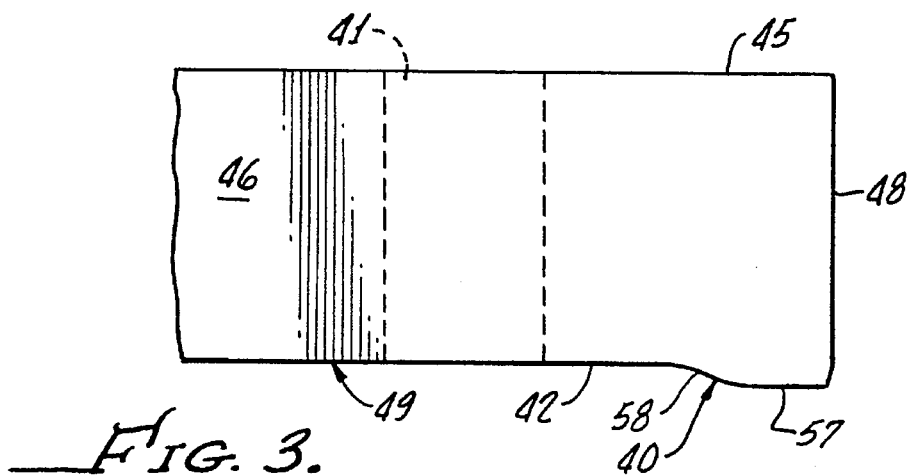
FIG. 3 is a further enlarged view of the right portion of FIG. 2.

Proceeding to a description of the preferred configuration of step or protuberance 40, and referring especially to FIGS. 1, 3 and 5, it is pointed out that there is a substantially flat-bottomed ridge 57 that is adjacent end 48, and that is parallel to the region of surface 49 at space 42, and that preferably extends all the way across the resistor body. On its side relatively adjacent hole 41, the step 40 is inclined towards the surface 49 at space 42. Thus, the step merges towards surface 49 at a region 58 that is preferably spaced from bolt hole 41.

The vertical distance between the bottom of ridge 57 and the adjacent portion of surface 49 (namely, at space 42) is in the range 0.0005 inch to 0.0040 inch for the most common sizes of resistors. The thickness of the resistor body, that is to say the distance between surfaces 49 and 45 of the resistors, is typically about 0.125 inch. Typically, the bottom and top surfaces of the resistor (package) are about 0.6 inch long and about 0.4 inch wide, the surface area of the bottom surface being less than 1 square inch.

Typically, the length of the resistor (package) is in the range 0.40 inch to 1.10 inches. Typically, the width of the resistor (package) is in the range 0.250 inch to 0.700 inch. Typically, the thickness of the resistor (package) is in the range 0.080 inch to 0.300 inch.

In practicing the invention, it is merely necessary to convert existing molds by deepening the bottoms thereof adjacent the bolt-hole end thereof in a manner complementary to the step 40. Then, the resistor is merely mounted on a heatsink, and a bolt (screw) is inserted and cranked down to the same extent as is conventional in the art. The result, especially with the resistor of FIG. 7 hereof having the ceramic heat-dissipating surface 14a, is a striking increase in power-handling capability.

The relationship between step 40, bolt 54, and the resistor portion remote from hole 41 (namely, at heat-dissipating surface 43) is that of a third-class lever, with the resistor (package) body being the actual lever. Step 40 is the fulcrum, bolt 54 applies the force, and surface 53 and grease thereon are the resistance or load.

TABLE I

Table of Numbers and Components from Patent 5,304,977, Except "a" Is Added to Each Number, and Which Appear in FIG. 7 of this Specification 10a synthetic resin body (molded)
11a flat upper surface
12a lower surface
13a substrate (ceramic)
14a bottom surface of substrate
16a bolt hole
22a lead or terminal TABLE I-continued Table of Numbers and Components from Patent 5,304,977, Except "a" Is Added to Each Number, and Which Appear in FIG. 7 of this Specification 23a end section
24a tab
26a riser portion
27a section
28a shoulder
29a prong
31a notch in riser
32a notch or recess

TABLE II

Table of Numbers and Components from Patent 5,291,178, and Which Appear in FIG. 6 of This Specification 10 substrate
11 internal heatsink (metal)
12 metalization traces
13 resistive film
14 coating (overglaze)
15 leads or pins
17 body of synthetic resin (molded)
31 top surface of molded body
35 end surface
36 end surface
38 hole In the preferred embodiments of the invention, the resistive element is flat, being a ceramic substrate on which resistive film is deposited—preferably by screen printing.

In the embodiment of FIG. 7, as described in the related patent, there is a film of resistive material on the upper surface of substrate 13a.

As shown by both FIG. 6 and FIG. 7, the amount of synthetic resin above the horizontal medial plane is distinctly greater than the amount of resin beneath such plane.

The foregoing detailed description is to be clearly understood as given by way of illustration and example only, the spirit and scope of this invention being limited solely by the appended claims.

What is claimed is:

1. A power resistor, which comprises:
   (a) a resistive element,
   (b) a generally rectangular body molded around said resistive element,
      said body being molded of synthetic resin molding material,
      said body having a top surface and a bottom surface, the relationship between said resistive element and said body being such that said resistive element is located relatively near said bottom surface, and is spaced relatively far from said top surface,
      said bottom surface being downwardly somewhat convex due to forces inherent in said molding material and in said location of said resistive element in said body, thereby creating a downward convexity, said convexity being longitudinal to said body,
   (c) a bolt hole extending through said body,
      said bolt hole being transverse to said bottom surface,
      said bolt hole being nearer to one end of said body than to the other end of said body, and
   (d) protuberant means fixedly provided on said bottom surface of said body on the side of said bolt hole that is remote from said other end of said body,
      at least the great majority of said resistive element being between said bolt hole and said other end of said body,
      said protuberant means being so shaped, sized and located that when a bolt is passed through said bolt hole and tightened relative to an underlying heatsink having a flat upper surface, said protuberant means causes the region of said bottom surface that is nearest said resistive element to be substantially closer to said flat upper surface of said heatsink than it would be if said protuberant means were not present.

2. The power resistor as claimed in claim 1, in which said power resistor is combined with a bolt and with a heatsink having a flat upper surface, said bolt extending through said bolt hole into said heatsink.

3. The power resistor assembly as claimed in claim 2, in which thermal grease is provided between said bottom surface and said flat upper surface.

4. The power resistor combination as claimed in claim 2, in which said resistive element includes a ceramic substrate having a flat bottom side that is substantially flush with said bottom surface, said bottom side being exposed and being adapted to be close to said flat upper surface of said heatsink when said bolt is tightened.

5. The power resistor as claimed in claim 1, in which said protuberant means has a lower side that is spaced below said bottom surface a distance in the range of 0.0005 inch to 0.0040 inch.

6. The power resistor as claimed in claim 5, in which the length of said body is in the range of 0.400 inch to 1.10 inches.

7. The power resistor combination as claimed in claim 2, in which said resistive element is close to a metal plate that is part of said power resistor, said metal plate having a bottom side that is substantially flush with said bottom surface, said bottom side being exposed and being adapted to be close to said flat upper surface of said heatsink when said bolt is tightened.

8. The power resistor as claimed in claim 7, in which said resistive element is bonded to said metal plate.

9. A highly thermally efficient, heatsink-mountable heat-transfer package for an electrical device that generates substantial heat when operating, which comprises:
   (a) a generally rectangular body of synthetic resin,
      said body being molded around an electrical device in such a relationship that the amount of resin above the horizontal medial plane of said body is greater than the amount of resin below said plane,
      said body having a bottom or mounting surface adapted to be mounted on a flat surface of a heatsink,
      said bottom surface being downwardly convex longitudinally of said body,
      said body having a mounting hole therethrough for a bolt, which mounting hole is perpendicular to said bottom surface and which is not centered in said body but instead is nearer to one end of said body than to the other end of said body, and
   (b) protuberant means provided on said bottom surface of said body on the side of said bolt hole that is remote from said other end of said body to engage said flat surface of said heatsink and increase heat-transfer efficiency when a bolt is inserted through said mounting hole and tightened to said heatsink at said flat surface of said heatsink.

10. The heatsink-mountable heat-transfer package for an electrical device, as claimed in claim 9, in which said electrical device is a resistive element.

11. The heatsink-mountable heat-transfer package for an electrical device, as claimed in claim 10, in which said resistive element comprises a thin flat ceramic substrate having parallel upper and lower surfaces and having a resistive film on the upper surface thereof.

12. The heatsink-mountable heat-transfer package for an electrical device, as claimed in claim 11, in which there is no metal piece or resin beneath said lower surface of said substrate.

13. The heatsink-mountable heat-transfer package for an electrical device, as claimed in claim 10, in which said resistive element comprises a thin flat ceramic substrate having parallel upper and lower surfaces and having a resistive film on said upper surface thereof, and further comprises a substantially flat metal piece bonded to said lower surface of said substrate, said metal piece having a top and a bottom, said bottom of said metal piece being exposed.

14. The heatsink-mountable heat-transfer package for an electrical device, as claimed in claim 9, in which said package is disposed on a flat surface of a heatsink having a hole therein, and in which a bolt is inserted through said mounting hole in said body and into said hole in said heatsink and is tightened sufficiently to cooperate with said protuberant means in urging towards said heatsink the portion of said body between said mounting hole and said other end of said body, and in which said electrical device is located at least primarily in said portion of said body that is between said mounting hole and said other end of said body.

15. A package for the heat-generating active element of an electrical component, which comprises:

(a) a synthetic resin body molded around the heat-generating active element, in such manner that:
   i) the bottom of said body is nominally flat, and
   ii) there is more of the synthetic resin above the medial plane of said body than below it,
      whereby said bottom surface of said body is externally convex or cambered in a direction longitudinal to said body, (b) a hole through said body, generally perpendicular to said bottom surface, and spaced away from the center of said body towards one end thereof, and (c) a step provided on said bottom surface between said hole and said one end,
   characterized in that when a bolt is passed through said hole and tightened relative to the flat surface of a heatsink, a third-class lever action results to increase heat transfer from said body to said heatsink.

16. The heatsink-mountable heat-transfer package for an electrical device, as claimed in claim 9, in which said protuberant means is spaced from said mounting hole.

17. The heatsink-mountable heat-transfer package for an electrical device, as claimed in claim 9, in which said protuberant means is a step molded on said bottom or mounting surface, and in which said step is perpendicular to the longitudinal axis of said body.

18. The heatsink-mountable heat-transfer package for an electrical device, as claimed in claim 9, in which said protuberant means is a ridge the height of which, relative to said mounting surface, is in the range of 0.0005 inch to 0.0040 inch.

19. The heatsink-mountable heat-transfer package for an electrical device, as claimed in claim 18, in which the length of said package is in the range 0.400 inch to 1.10 inches, the width of said package is in the range 0.250 inch to 0.700 inch, and the thickness of said package is in the range 0.080 inch to 0.300 inch.

* * * * *